(12) United States Patent
Delano et al.

(10) Patent No.: US 7,750,732 B1
(45) Date of Patent: Jul. 6, 2010

(54) ADAPTIVE RAIL AMPLIFIER (ARA) TECHNOLOGY

(75) Inventors: Cary L. Delano, Los Altos, CA (US); Brian B. North, Los Gatos, CA (US); Arun Jayaraman, San Ramon, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 22 days.

(21) Appl. No.: 12/326,795

(22) Filed: Dec. 2, 2008

Related U.S. Application Data

(60) Provisional application No. 60/992,224, filed on Dec. 4, 2007.

(51) Int. Cl.
*H03F 1/14* (2006.01)
(52) U.S. Cl. .......................................... 330/51; 330/127
(58) Field of Classification Search ...................... 330/9, 330/51, 127, 124 R
See application file for complete search history.

(56) References Cited

U.S. PATENT DOCUMENTS

| | | | |
|---|---|---|---|
| 4,030,045 A | 6/1977 | Clark |
| 4,324,950 A | 4/1982 | Strickland |
| 5,038,325 A | 8/1991 | Douglas et al. |
| 5,072,171 A | 12/1991 | Eng |
| 5,115,203 A | 5/1992 | Krett et al. |
| 5,347,171 A | 9/1994 | Cordoba et al. |
| 5,491,839 A | 2/1996 | Schotz |
| 5,694,072 A | 12/1997 | Hsiao |
| 6,107,886 A | 8/2000 | Kusakabe |
| 6,215,356 B1 | 4/2001 | Servaes et al. |
| 6,256,482 B1 | 7/2001 | Raab |
| 6,304,138 B1 | 10/2001 | Johnson |
| 6,323,729 B1 | 11/2001 | Sevenhans et al. |
| 6,417,736 B1 | 7/2002 | Lewyn |
| 6,486,733 B2 | 11/2002 | Myers et al. |
| 6,504,426 B2 | 1/2003 | Picha et al. |
| 6,538,514 B2 | 3/2003 | Harvey |
| 6,614,310 B2 | 9/2003 | Quarfoot et al. |
| 6,636,103 B2 | 10/2003 | Wurcer et al. |
| 6,815,988 B2 | 11/2004 | Sanduleanu |

(Continued)

FOREIGN PATENT DOCUMENTS

WO    WO 97/23005 A1    6/1997

(Continued)

OTHER PUBLICATIONS

"TDA7563 Multifunction Quad Power Amplifier with Built-In Diagnostics Features," May 2003. ST Microelectronics.

(Continued)

*Primary Examiner*—Robert Pascal
*Assistant Examiner*—Khiem D Nguyen
(74) *Attorney, Agent, or Firm*—Schwegman, Lundberg & Woessner, P.A.

(57) ABSTRACT

An efficient class-G amplifier having multiple rails is configured with parallel class AB amplifiers powered by at least one rail supplying a voltage that can be varied in response to signal characteristics, typically as sensed at an output across a load. In a specific embodiment, an analog-to-digital converter is coupled to a digital signal processor that converts signals into a programmed voltage level for setting the voltage rail.

4 Claims, 2 Drawing Sheets

U.S. PATENT DOCUMENTS

| | | |
|---|---|---|
| 6,838,942 B1 | 1/2005 | Somerville et al. |
| 6,853,244 B2 | 2/2005 | Robinson et al. |
| 6,975,175 B2 | 12/2005 | Sanduleanu |
| 6,982,600 B2 | 1/2006 | Harvey |
| 6,987,417 B2 | 1/2006 | Winter et al. |
| 6,993,302 B2 | 1/2006 | Bausov et al. |
| 6,998,914 B2 | 2/2006 | Robinson |
| 7,026,868 B2 | 4/2006 | Robinson et al. |
| 7,034,614 B2 | 4/2006 | Robinson et al. |
| 7,042,284 B2 | 5/2006 | Moons et al. |
| 7,043,213 B2 | 5/2006 | Robinson et al. |
| 7,061,327 B2 | 6/2006 | Doy |
| 7,061,328 B2 | 6/2006 | Doy |
| 7,106,135 B2 | 9/2006 | Makino et al. |
| 7,183,857 B2 | 2/2007 | Doy et al. |
| 2010/0019843 A1* | 1/2010 | Hellberg et al. ......... 330/124 R |

FOREIGN PATENT DOCUMENTS

WO     WO 00/00983 A1     1/2000

OTHER PUBLICATIONS

MAX9730 2.4W, Single-Supply, Class G Amplier, Dec. 2006, Maxim Integrated Products.
International Search Report PCT/US07/064546 dated Feb. 28, 2008.
International Search Report PCT/US07/064543 dated Feb. 22, 2008.
International Search Report PCT/US07/064549 dated Feb. 22, 2008.
International Search Report PCT/US07/064548 dated Mar. 19, 2008.

* cited by examiner

ADAPTIVE RAIL AMPLIFIER (ARA) TECHNOLOGY

CROSS-REFERENCES TO RELATED APPLICATIONS

The present application claims benefit under 35 USC 119(e) of U.S. provisional Application No. 60/992,224, filed on Dec. 4, 2007, entitled "Adaptive Rail Amplifier (ARA) Technology," the content of which is incorporated herein by reference in its entirety.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to analog signal amplification and particularly to high-efficiency power amplifiers.

A signal amplifier draws power from a fixed power supply, $V_{dd}$ commonly referred to as a rail, which is provided by a power source such as battery or a battery followed by a voltage regulator provided for voltage stability. For portable amplifiers, the efficiency of power drawn from the source is very important since an inefficient usage of power can result in a rapid drain of the battery resulting in short operating times between recharging or replacement. The ratio of the power delivered to the load $P_{load}$, to the power drawn from the battery ($P_{batt}$) is the measure of efficiency of the signal amplifier.

$$\xi = P_{load}/P_{batt} \quad (1)$$

Some types of amplification techniques (e.g., class D) that have been used to increase efficiency employ a switching device as the amplifier. The switching device typically places constraints on the type of signals for which such amplifiers can be used since the device operation is non-linear. However, the present invention is directed to classes of amplifiers for use for both linear and non-linear signal amplification. Class G amplifiers can be used for both linear and nonlinear applications. Class G amplifiers employ several amplifiers in parallel that operate off of different rail voltages, each of which contribute varying amounts of power to the load depending on the signal level. Such amplifiers are more efficient in power delivery and can be used for linear signal amplification. Class G amplifiers can approach 80-90% peak efficiency compared to class AB amplifiers (64% peak efficiency). In addition, they offer the benefit of better efficiencies at lower power levels, which is important where signals have high peak-to-average ratios.

Conventional implementation of class-G amplifiers fixes the number of parallel amplifiers and operating rail. The voltage rails ($VR_i$, i=amplifier instance) required by the parallel amplifiers are usually provided through separate external power sources or are generated using a single power source employing reactive components (capacitor or inductor) as intermediate power stores for power delivery as required. A capacitive charge pump is one such power store. Reference is made to U.S. Pat. Nos. 7,061,327, 7,061,328, and 7,183,857 for background. The efficiency of a class-G amplifier depends on the number of rails as well as the input signal statistics, such as peak-to-average ratio. The actual value depends on the difference between the rail voltage and the signal threshold at which transitions between different amplifiers occur. Theoretical efficiency of a class-G amplifier approaches 80-90% independent of the load power when the number of rails approaches infinity. However, it is impractical to have large numbers of rails.

SUMMARY OF THE INVENTION

According to the invention, an efficient class-G amplifier having multiple rails is configured with parallel class AB amplifiers powered by at least one rail with a voltage that can be varied in response to signal characteristics, typically as sensed at an output across a load. In a specific embodiment, an analog-to-digital converter is coupled to a digital signal processor that converts signals into a programmed voltage level for setting the voltage rail.

The invention will be better understood by reference to the following detailed description in connection with the accompanying drawings.

DETAILED DESCRIPTION OF THE INVENTION

Figure 1:
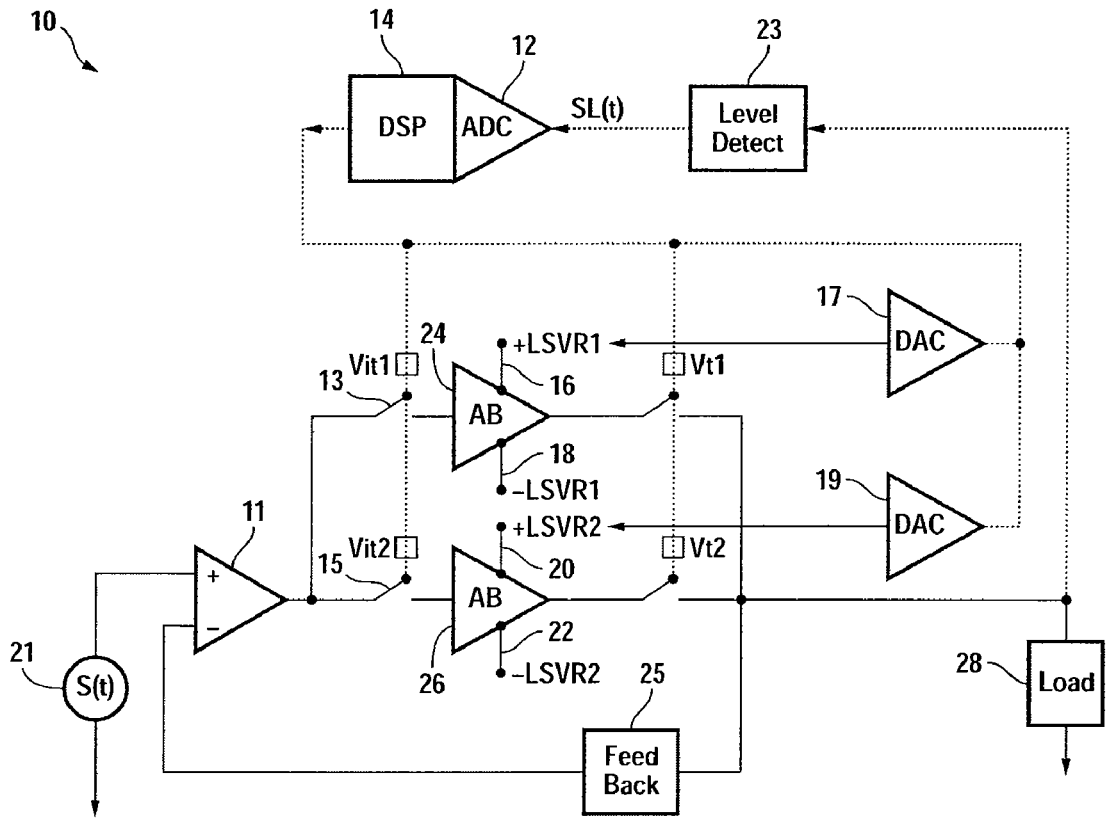
FIG. 1 is a block diagram of a specific embodiment of the invention.

The present invention can maximize amplifier efficiency over a wide-range of load powers by the technique described herein. Referring to FIG. 1, in a general embodiment, an adaptive rail amplifier 10 comprises a preamplifier 11 driving parallel class AB amplifiers 24, 26 whose inputs are selectively switched at switches 13, 15 and whose outputs are selectively switched at switches 17, 19, a feedback network 25 from the output of the parallel amplifiers 24, 26 to the inverting input of the preamplifier 11, a level detector 23 for sensing level across a load 28 (or alternatively across the output of the preamplifier 11 or the input of the preamplifier 11), and an analog-to-digital converter (ADC) 12 that in its simplest form is a comparator used to select which rail is to be active and if more complex can aid in making decisions about the best setting of the voltage of the inner rail and to quantize the level of power output to the load 28 as an input signal $SL_i(t)$. The sample $SL_i(nTs)$ from the ADC 12 then serves as input to a digital-signal processor (DSP) 14, along with previously quantized samples (of a previous time interval) to arrive at a selected current optimal value $LSVR_i(nTs)$ (shown as +LSVR1, −LSVR1, +LSVR2, −LSVR2) for level sensitive voltage rails 16, 18, 20, 22 of the parallel class AB amplifiers 24, 26. The ADC 12 and the DSP 14 work together to make decisions that improve the setting of the voltage of the inner rail based on recent samples of how much time the output signal is statistically spending above or below the inner rail voltage. If the ADC is more than just a comparator it can determine not only if it is above or below the threshold but how far above or below the threshold the output signal has been. The specific power levels are determined by parallel digital to analog power output converters (DACs) 17, 19 configured to supply complementary voltages at the programmed voltage levels at each voltage rail. The time interval of sampling is Ts. These values are used for the next kTs intervals, where the value k is determined by the level statistics of the input signal S(t) 21. There is an optimum voltage setting for the inner rail that minimizes the overall power consumption of the system. In an audio amplifier, the optimum voltage setting is dependent on the volume setting (size) of the signal and the peak-to-average of the signal (signal shape). It is not necessary to find the optimum point. However, by adjusting the inner rail voltage based on previous output signal samples, overall power consumption can be reduced significantly.

Figure 2:
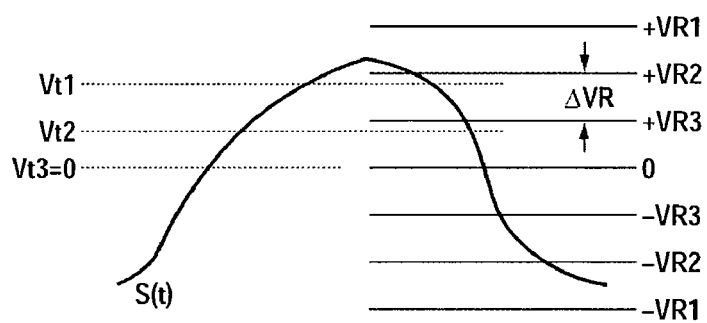
FIG. 2 is a graph illustrating operation of a specific embodiment of the invention.

Referring to FIG. 2, VR1 and its complement −VR1 are the outer rail voltages, usually fixed. VR2 and VR3 and their complements −VR2 and −VR3 are alternative voltage options for the inner rail voltage. In other words, the voltage on the inner rail may vary. Vt1 is the positive threshold for the correct switching point for swapping between the two Class-AB amplifiers 24, 26 if the inner rail voltage is VR2. Vt2 is the positive threshold for the correct switching point for swapping between the two Class-AB amplifiers 24, 26 if the inner rail voltage is VR3. ΔVR is the voltage difference between different possible inner rail voltage settings VR3 and VR2. This is effectively the resolution of the setting of the Class-G switching point. Ideally the delta would be small so that there could be many different values of the inner rail voltages, but such a design sufficiently complicates the power generation section that it is to be avoided.

A basic implementation comprises a comparator circuit for the ADC 12 and an accumulator with reset for the DSP 14 having internally a digital threshold comparator for generating a 1-bit signal to switch between two sets of rails 16,18 and 20, 22. Whereas more complexity would be needed to switch between a greater number of rails, in the present invention, only two sets of rails are needed for the voltage range that is determined by the signal conditions.

Figure 3:
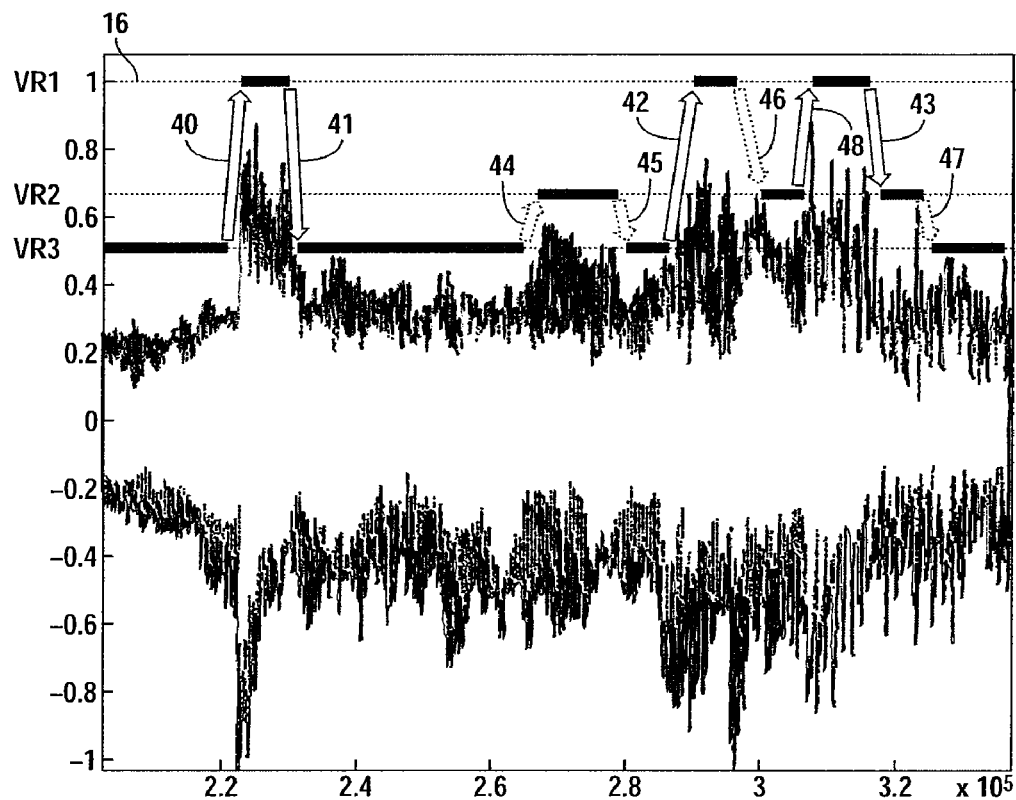
FIG. 3 is a graph illustrating operation of the invention.
Figure 4:
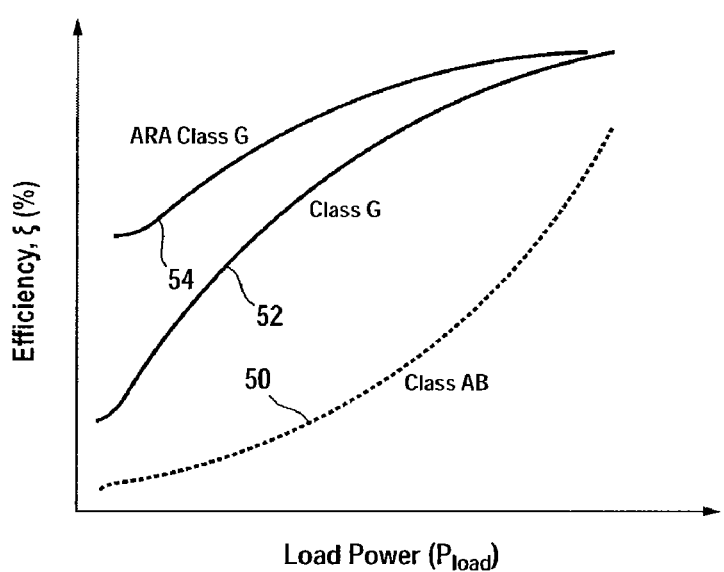
FIG. 4 is a graph comparing efficiencies of operation as a function of load of the amplifier of the present invention with other types of amplifiers.

FIG. 3 shows the operation of an implementation of a dual-rail, multi-voltage power amplifier in accordance with the invention. The highest rail at voltage VR1, with its complement, is left unaltered during the period of interest. The signal level statistics of the input signal S(t) are used to select which amplifier 24 or 26 is selected and to adjust the voltage on the rail of the second amplifier 26 (FIG. 1) between VR2 and VR3. The transitions between the voltages VR2 and VR3 indicated by numerals 44-48 indicate when the rail of the second amplifier 26 is modified. The voltage selected by the DSP 14 may be one or more increments. As shown herein, the voltage is selected only between VR2 and VR3, based on signal conditions.

One of the main advantages of this approach compared to alternatives is the retention of the ability to handle signals which are temporarily higher than the intermediate rail at either voltage VR2 or VR3 without causing distortion, since the highest rail (VR1) amplifier takes over seamlessly, as selected by the DSP 14. Hence, this technique can realize the best efficiency possible with a linear amplifier at all load power levels.

The comparative efficiency of the adaptive rail amplifier according to the invention under various load power conditions is shown in FIG. 6. The efficiency 50 of a is low at low power but increases exponentially. The efficiency 52 of a prior art fixed rail class G amplifier is also relatively low at low power but is more efficient than a conventional class AB amplifier, increasing to a maximum that is higher than a conventional class AB amplifier. In comparison, the efficiency 54 of an adaptive rail-type class G amplifier of the present invention is substantially higher than that of any other linear amplifier at low power, although its efficiency advantage is comparable to that of a prior art class G amplifier at the maximum power levels as the flexible operation of the intermediate rail is no longer a factor. This is an understandable condition to be expected. Nevertheless, the overall efficiency of an amplifier according to the invention is evident.

This invention has been explained with reference to specific embodiments. Other embodiments will be evident to those of ordinary skill in the art. It is therefore not intended that this invention be limited, except as indicated by the appended claims.

What is claimed is:

1. A linear signal amplifier for amplifying a signal at a load comprising:
   a first power rail;
   a second power rail
   a first class AB amplifier having a first power supply at the first power rail;
   a second class AB amplifier having a second power supply at the second power rail;
   a level detector for sensing signal power;
   an analog to digital converter for converting an analog output of the level detector to a digitized value representative of the signal power;
   a digital signal processor coupled to receive the digitized value and to select a power rail;
   a digital to analog converter for setting power level on the second power rail; and
   switching means responsive to the power level and coupled to alternately switch input signal paths to output signal paths between the first class AB amplifier and the second class AB amplifier in response to said digital to analog converter.

2. The amplifier according to claim 1 wherein said level detector is coupled to the load to monitor amplifier output signal power for controlling power switching.

3. The amplifier according to claim 1 wherein said second power rail has a maximum voltage less than a minimum voltage of said first power rail.

4. The amplifier according to claim 1 wherein said digital to analog converter comprises a comparator for generating a 1-bit signal to switch between said first power rail and said second power rail.

* * * * *